United States Patent
Gomez et al.

(10) Patent No.: US 6,985,044 B2
(45) Date of Patent: *Jan. 10, 2006

(54) VARACTOR FOLDING TECHNIQUE FOR PHASE NOISE REDUCTION IN ELECTRONIC OSCILLATORS

(75) Inventors: Ramon Alejandro Gomez, San Juan, CA (US); Lawrence M. Burns, Luguna Mills, CA (US); Alexandre Kral, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/965,027

(22) Filed: Oct. 15, 2004

(65) Prior Publication Data

US 2005/0083143 A1     Apr. 21, 2005

Related U.S. Application Data

(60) Continuation of application No. 10/395,116, filed on Mar. 25, 2003, now Pat. No. 6,806,787, which is a division of application No. 09/738,858, filed on Dec. 14, 2000, now Pat. No. 6,563,392.

(60) Provisional application No. 60/170,840, filed on Dec. 14, 1999.

(51) Int. Cl.
  *H03B 5/12* (2006.01)
  *H03L 7/099* (2006.01)
(52) U.S. Cl. ............... 331/117 FE; 331/17; 331/36 C; 331/177 V
(58) Field of Classification Search ........... 331/36 C, 331/117 R, 117 FE, 117 D, 175, 177 R, 177 V, 331/179
See application file for complete search history.

(56) References Cited

U.S. PATENT DOCUMENTS

| | | | |
|---|---|---|---|
| 3,526,859 A | 9/1970 | Putzer | |
| 3,538,450 A | 11/1970 | Andrea et al. | |
| 4,353,038 A | 10/1982 | Rose et al. | |
| 4,503,401 A | 3/1985 | Kyriakos et al. | |
| 4,510,461 A | 4/1985 | Dickes et al. | |
| 4,621,205 A | 11/1986 | Miller | |
| 5,030,926 A | 7/1991 | Walden | |
| 5,254,958 A | 10/1993 | Flach et al. | |
| 5,648,744 A | 7/1997 | Prakash et al. | |
| 5,739,730 A | 4/1998 | Rotzoll | |
| 5,821,818 A | 10/1998 | Idei et al. | |
| 6,091,304 A | 7/2000 | Harrer | |
| 6,563,392 B2 * | 5/2003 | Gomez et al. | 331/117 FE |

OTHER PUBLICATIONS

Copy of International Search Report for International Application No. PCT/US00/34095, filed Dec. 14, 2000.

Hajimiri et al., "A General Theory of Phase Noise in Electrical Oscillators," IEEE Journal of Solid-State Circuits, vol. 33, No. 2, Feb. 1998, pp. 179-194.

Kral et al., "RF-CMOS Oscillators with Switched Tuning," IEEE 1998 Custom Integrated Circuits Conference, May 11-14, 1998, pp. 26.1.1-26.1.4, pp. 555-558.

(Continued)

*Primary Examiner*—David Mis
(74) *Attorney, Agent, or Firm*—Sterne, Kessler, Goldstein & Fox, P.L.L.C.

(57) ABSTRACT

A varactor folding technique reduces noise in controllable electronic oscillators through the use of a series of varactors having relatively small capacitance. A folding circuit provides control signals to the varactors in a sequential manner to provide a relatively smooth change in the total capacitance of the oscillator. Consequently, effective control of the oscillator is achieved with accompanying reductions in oscillator noise such as flicker noise.

22 Claims, 7 Drawing Sheets

OTHER PUBLICATIONS

Leeson, "A Simple Model of Feedback Oscillator Noise Spectrum," Proceedings of the IEEE—Frequency Stability, Manuscript received: Dec. 10, 1965, revised: Dec. 29, 1965, Feb., 1966, pp. 329-330.

Razavi, "Oscillators," RF Microelectronics, Chapter 7, pp. 206-246.

Rohde, "Microwave and Wireless Synthesizers—Theory and Design," pp. 567-572.

* cited by examiner

VARACTOR FOLDING TECHNIQUE FOR PHASE NOISE REDUCTION IN ELECTRONIC OSCILLATORS

CROSS-REFERENCE TO RELATED APPLICATION

This application is a continuation of U.S. patent application Ser. No. 10/395,116, filed Mar. 25, 2003 now U.S. Pat. No. 6,806,787, which is a divisional of U.S. patent application Ser. No. 09/738,858, filed Dec. 14, 2000 now U.S. Pat. No. 6,563,392, which claims the benefit of the U.S. Provisional Application No. 60/170,840, filed Dec. 14, 1999, all of which are incorporated herein by reference in their entireties.

BACKGROUND OF THE INVENTION

Communication systems use oscillators to process various signals used in the communication process. In a typical communication system, an information signal (e.g., a television program) is modulated onto a high frequency carrier signal to facilitate transmission of the signal. Such modulation may be accomplished, for example, by varying the phase of the carrier signal according to the information in the signal. Through the use of different carrier signals of different frequencies, many information signals may be simultaneously broadcast in a communication system. A receiver in the communication system typically uses an oscillator to separate the information signal from the carrier signal. Moreover, to accommodate the various carrier frequencies, the oscillator may be controllable so that the frequency of the signal generated by the oscillator may be varied as necessary.

In practice, oscillators do not generate a perfect signal; that is, a signal with precisely fixed frequency, amplitude and phase characteristics. Rather, due to a variety of factors including internal noise generated by the electronic components of the oscillator, the frequency, amplitude and phase of an oscillator will vary over a fairly narrow range over time.

Low-noise electronic oscillators are crucial to the effective operation of communication receivers and transmitters that use superheterodyne techniques and modulation formats that involve the phase of signal. As indicated above, amplitude and phase modulation are present in all real oscillators; however the nature of oscillators is such that for frequencies approaching the center frequency of the oscillation, the noise is dominated by phase fluctuations. Fluctuations in the phase of the transmitter or receiver oscillators corrupt the intended phase modulation of the signal in systems which use phase or frequency modulation. Phase noise may also reduce the ability of a radio system to reject or discern unwanted channels close in frequency to the desired channel.

Various techniques exist in the art to reduce phase noise such as phase locking to a less-noisy reference signal and the use of tracking phase-locked loops in the receiver. Nevertheless, system performance is often limited by the quality of available oscillators at practical levels of cost, size, and power dissipation.

Oscillators also may suffer from a significant level of noise due to up-conversion of flicker (1/f) noise from low frequencies to near the center frequency of the oscillator. Flicker noise occurs at low frequencies in nearly all electronic components.

SUMMARY OF THE INVENTION

The invention is directed to techniques for reducing noise in electronic oscillators. A folding technique is described for controlling circuit parameters in an electronic oscillator by separately controlling a plurality of circuit elements that affect those parameters. Through the use of a plurality of circuit elements, substantial noise reduction can be achieved. In addition, the use of a folding technique facilitates making smooth transitions when sequentially activating circuit elements. Thus, the folding technique described herein ensures that the combined effect of the adjustable circuit elements results in a relatively smooth adjustment of the circuit parameters.

In one embodiment the oscillator includes a plurality of varactors in the oscillator's tank circuit. The frequency of the oscillator is controlled, in part, by varying the voltage across the varactors. By using several varactors having relatively small capacitance instead of one varactor having a relatively large capacitance, flicker noise can be substantially reduced in the oscillator. In addition, a folding circuit is utilized to control the varactors so that each varactor is activated in a substantially sequential manner, relative to one another, such that the overall change in capacitance in the tank circuit occurs in a relatively smooth manner, without substantial transient effects.

In one embodiment, the folding technique takes advantage of a sigmoidal response characteristic of the varactor components. This sigmoidal response characteristic has the effect that the capacitance of the varactor changes in a substantially linear manner when a particular range of voltages are applied across the varactor. Outside that voltage range, however, the capacitance of the varactor remains relatively constant. By properly folding the variable capacitance of each of these varactors into the tank circuit of the oscillator, the invention achieves very low noise characteristics in a controllable oscillator.

In another embodiment of the invention, a folding circuit sequentially activates varactors in the circuit such that when the circuit is ready to fold a new varactor into the circuit, the folding circuit couples a fixed capacitance to the tank circuit to replace a varactor that is then isolated from the circuit. Again, the folding circuit facilitates smooth transitions in the total capacitance of the oscillator tank circuit.

Accordingly, an oscillator constructed according to the invention includes at least one folding circuit responsive to at least one control signal, the folding circuit generating a plurality of varactor control signals; and at least one oscillator circuit comprising a plurality of varactors responsive to the plurality of control signals.

BRIEF DESCRIPTION OF THE DRAWINGS

In the drawings which constitute a part of this specification, an exemplary embodiment exhibiting various objectives and features hereof is set forth, specifically.

DESCRIPTION OF THE INVENTION

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

Figure 1:
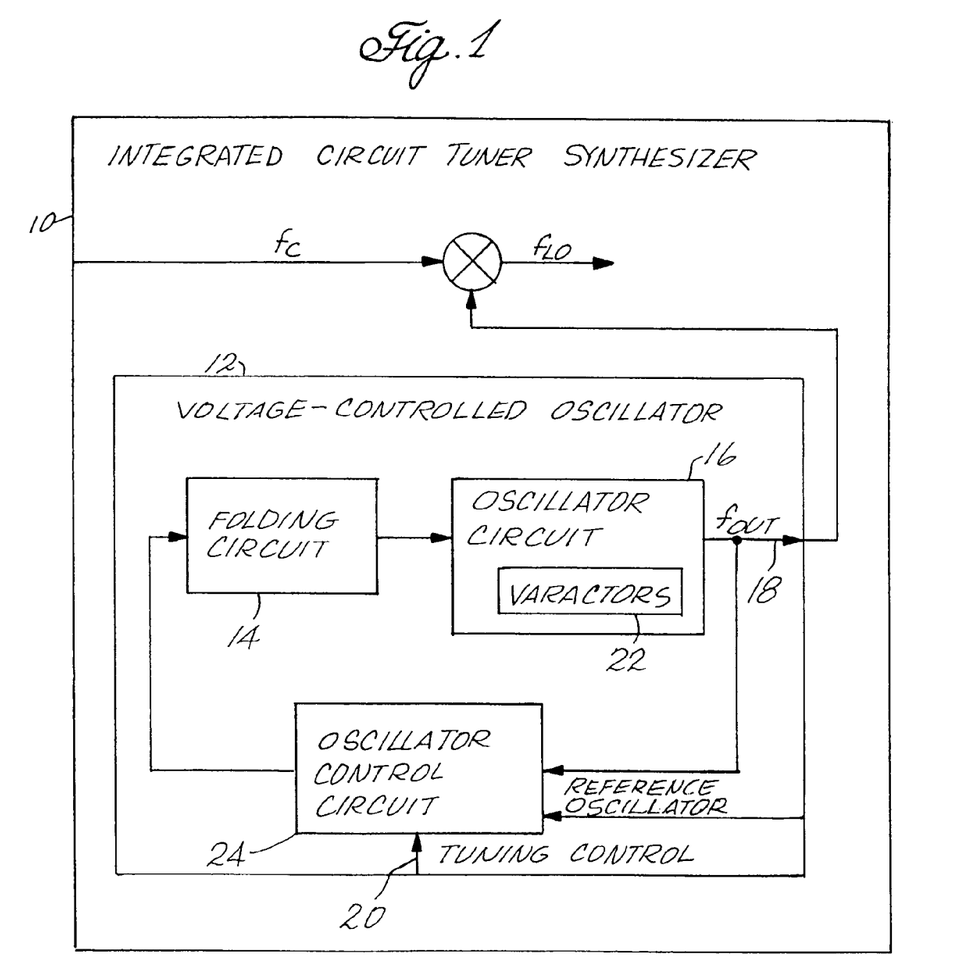
FIG. 1 is a block diagram illustrating an integrated circuit incorporating an oscillator with a varactor folding circuit according to one embodiment of the invention.

Referring initially to FIG. 1, in one embodiment a circuit constructed according to the invention is implemented in a tuner synthesizer chip (i.e., an integrated circuit) 10. The tuner synthesizer 10 incorporates a voltage-controlled oscillator ("VCO") 12 that generates a signal within a particular range of frequencies. As is known in the art, the oscillator signal may be used for a variety of operations such as mixing with various input and/or output signals for the purpose of up-converting or down-converting signals between carrier frequencies (e.g., $f_c$) and intermediate frequencies (e.g., $f_{LO}$).

In accordance with the invention, the voltage-controlled oscillator 12 includes a folding circuit 14 that operates in conjunction with an oscillator circuit 16 to produce an output signal 18 of a desired frequency, as specified by a tuning control signal 20 or other system requirements. The oscillator circuit 16 includes several varactors 22 in its reactive tank circuit. The voltage across these varactors 22 is individually controlled by the folding circuit 14. The folding circuit 14, in turn, is controlled by a control signal from an oscillator control circuit 24.

Figure 2:
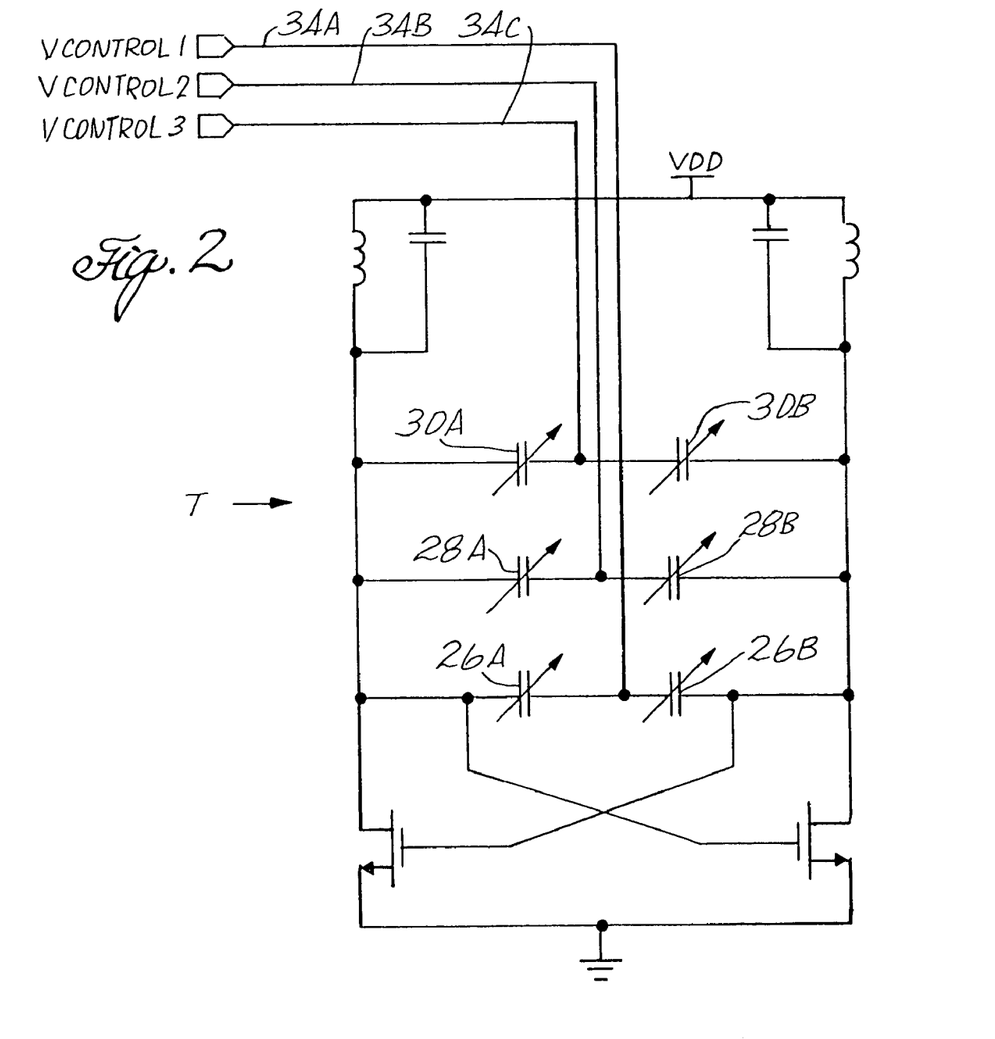
FIG. 2 is a schematic diagram illustrating one embodiment of an oscillator incorporating several varactors and associated control lines.

Referring now to FIG. 2, a simplified schematic of one embodiment of a CMOS differential LC oscillator with varactor tuning is described. As depicted in FIG. 2, the invention uses several relatively small varactors 26A–B, 28A–B and 30A–B rather than a single varactor (or a differential pair of varactors) as is commonly used for frequency tuning. As an example, if a conventional circuit used a single varactor having capacitance C, an equivalent circuit according to the invention might have N smaller varactors, each with a capacitance of approximately C/N.

A conventional varactor-tuned voltage-controlled oscillator normally receives one control voltage, a variable DC voltage which alters the capacitance of the varactor (and therefore the oscillation frequency) by exploiting the nonlinear capacitance vs. voltage characteristic of the varactor element. In practice, however, the nonlinear capacitance of the varactor is also modulated by the low-frequency flicker noise fluctuations, causing unwanted phase noise. This is described in the following equation:

$$\phi_{noise} = V_{flicker} \frac{dC_{varactor}}{dV_{flicker}} \frac{df_{center}}{dC_{varactor}} \frac{1}{f_{offset}}$$

where $f_{offset}$ is the frequency of the flicker noise component being considered. This equation follows from well-known FM modulation theory.

To achieve optimum oscillator operation, it is desirable to reduce the value of $C_{varactor}$ relative to the fixed capacitance of the circuit to reduce the impact that its fluctuations will have on the center frequency and thereby the phase. One approach has been to reduce $C_{varactor}$ to the minimum value necessary to cover thermal drift of the center frequency (so that the center frequency can be maintained constant as the transmitter or receiver changes temperature), and the remaining capacitance tuning is accomplished with switched fixed (constant) capacitors, which do not vary and therefore do not up-convert flicker noise.

This invention makes it possible to reduce the varactor capacitance further still. In one embodiment, the original single capacitor is, in effect, split into multiple smaller varactors. Each small varactor is then driven by its own control voltage. The multiple control voltages are derived from the original single control voltage in such a way that only one of the small capacitors is susceptible to modulation of its nonlinear capacitance by flicker noise fluctuations. Tests have shown that this technique may reduce the flicker noise up-conversion by $20\log_{10}N$ dB.

It should be appreciated that FIG. 2 depicts a simplified circuit schematic in order to facilitate the discussion of the invention. In practice, the varactors (e.g., 26A and 26B) associated with a given control signal (e.g., 34A) may be embodied in separate circuits. Such a design would reduce potential interference of one varactor with another varactor. Moreover, although FIG. 2 describes a CMOS circuit, the invention is applicable to virtually all electronic oscillators using varactors which suffer from flicker noise up-conversion to the center frequency via modulation of the nonlinear varactor capacitance.

It should also be appreciated that the number of varactors and associated control signals used in a given folding circuit and oscillator may depend on the range of control that is desired over the frequency of the oscillator. If a wide frequency range is desired, the effective size of the varactor (i.e., the sum of capacitance of the individual varactors) may need to be larger. This may necessitate using more individual varactors in order to maintain desired noise characteristics.

The teachings of the invention may be implemented in many ways. In one approach, the sigmoidal shape of the Cgs vs. Vgs curve of a MOSFET varactor is exploited. This approach is described in conjunction with FIGS. 3, 4 and 5. If the varactors do not have a sigmoidal C-V characteristic, another approach as described in conjunction with FIGS. 6 and 7 may be used.

Figure 3:
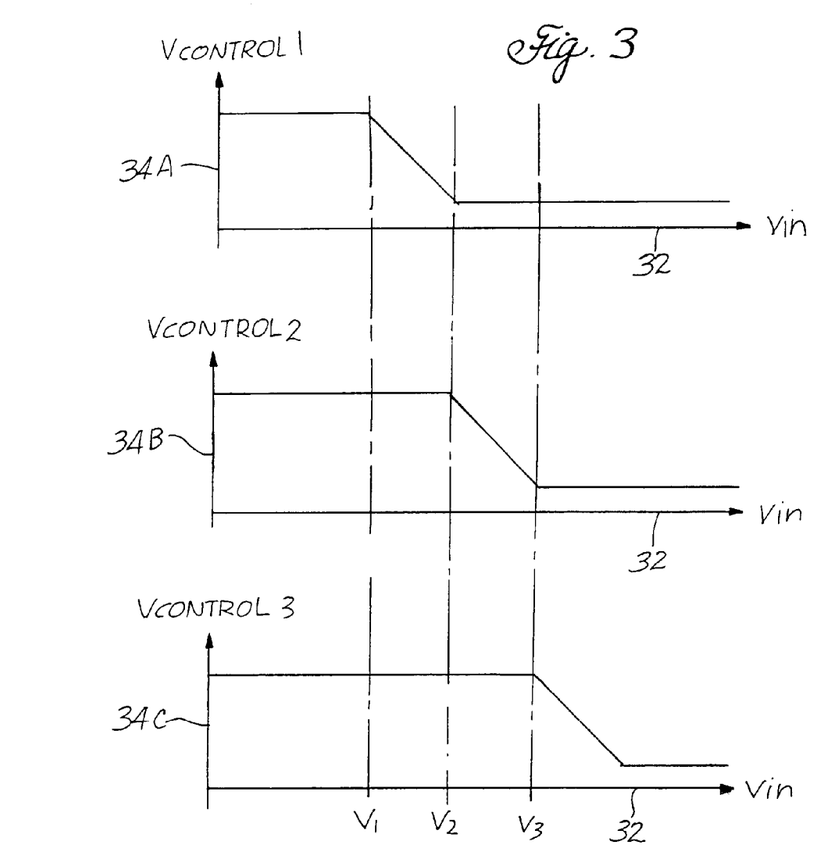
FIG. 3 is a graph illustrating transfer functions for an input control voltage and varactor control voltages according to one embodiment of the invention.

Referring now to FIG. 3, the three graphs represent transfer functions that describe the relationship between the input control voltage $V_{in}$ 32 and the varactor control voltages 34A–C. Each of the N MOSFET varactor pairs (e.g., varactors 26A–B, 28A–B and 30A–B depicted in FIG. 2) is driven through its full linear range sequentially by a folding circuit with one input and N outputs. In this example N is equal to three. Thus, the folding circuit effectively converts a relatively large input signal to multiple transfer functions with reduced output range.

Figure 4:
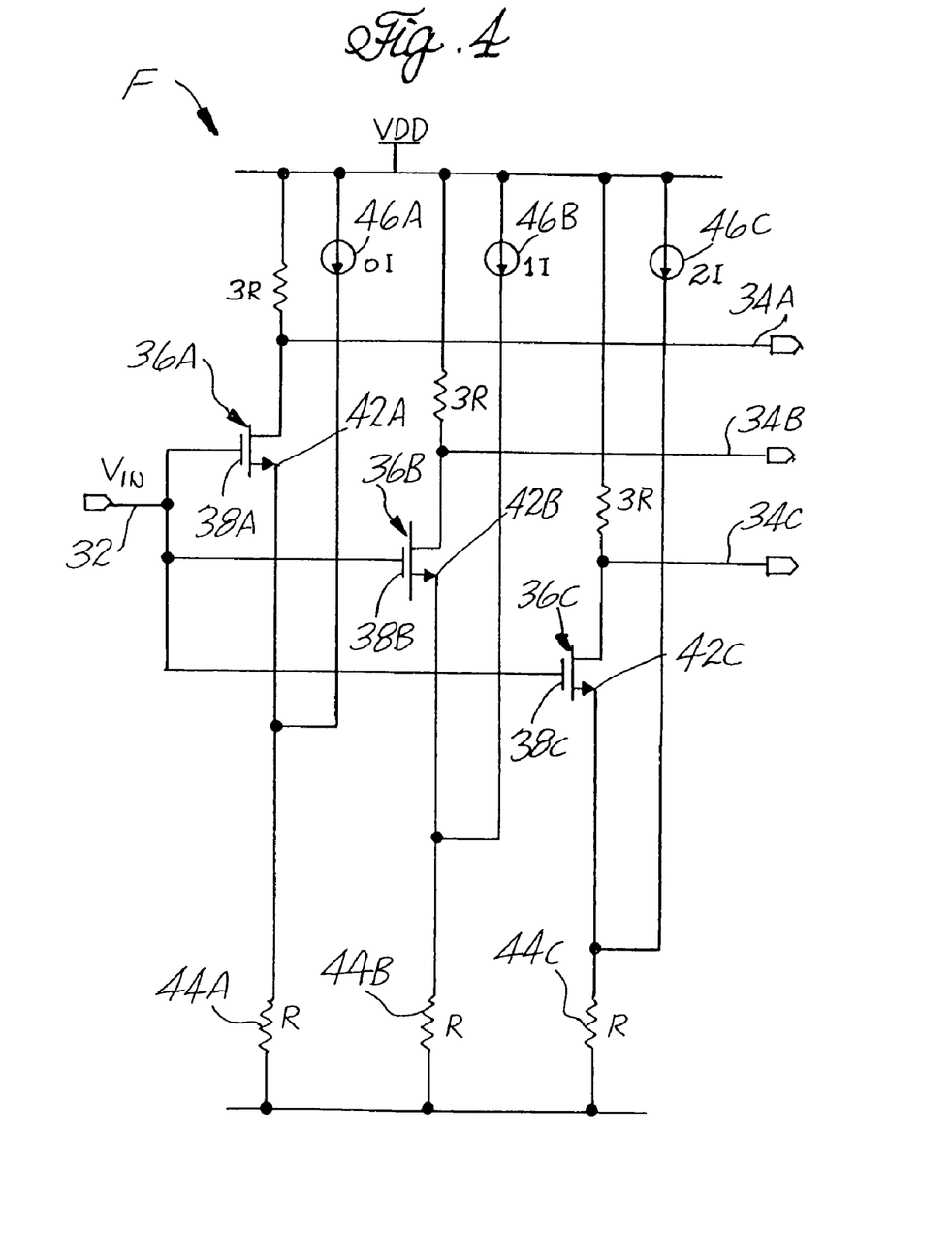
FIG. 4 is a schematic diagram of a folding circuit according to one embodiment of the invention.

FIG. 4 depicts one embodiment of a CMOS implementation of the transfer functions of FIG. 3 that exploits the sigmoidal characteristics of certain MOSFET varactors. The folding circuit F of FIG. 4 includes three field-effect transistors ("FETs") 36A–C connected with their gates 38A–C in parallel and driven by a control signal 32 (e.g., a phase-locked loop control signal). The sources 42A–C of each FET 36A–C are connected to ground via resistors 44A–C, each of which has the same value of resistance, designated R. Current sources 46A–C are injected into the source points 42A–C of each FET 36A–C so that the DC voltage at each source 42A–C is progressively higher. That is, the current sources 46A–C have successively higher constant current output as represented, for example, by the designations 0I, 1I and 2I, respectively. Thus, the voltage at the first source 42A will be biased at a desired DC level such as 1 V. The voltage at the second source 42B is higher by a defined unit such as 0.5 V. The voltage at the third source 42C is yet another unit higher than the voltage at the second source. Hence the second and third sources 42B–C are biased at 1.5 V and 2 V, respectively, in this example.

Referring again to the transfer functions depicted in FIG. 3, as the control signal 32 increases in value ($V_{in}$ increasing from left to right), the folding circuit F of FIG. 4 will produce three output signals ($V_{control1}$ 34A, $V_{control2}$ 34B and $V_{control3}$ 34C) staggered in their respective DC level. For example, assuming that a potential of 1 V across the gate to source junction ($V_{gs}$) is required to activate the FETs 36A–C; when the control signal 32 is below 2 V the voltage at the output signals 34A–C will be approximately equal to VDD. When the level of the control signal 32 is above 2 V (designated V1 in FIG. 3), the voltage level of the first output 34A will go down. When the control signal 32 is above 2.5 V (designated V2 in FIG. 3), the second output 34B will go down. When the control signal 32 is above 3 V (designated V3 in FIG. 3), the third output 34C will go down.

Figure 5:
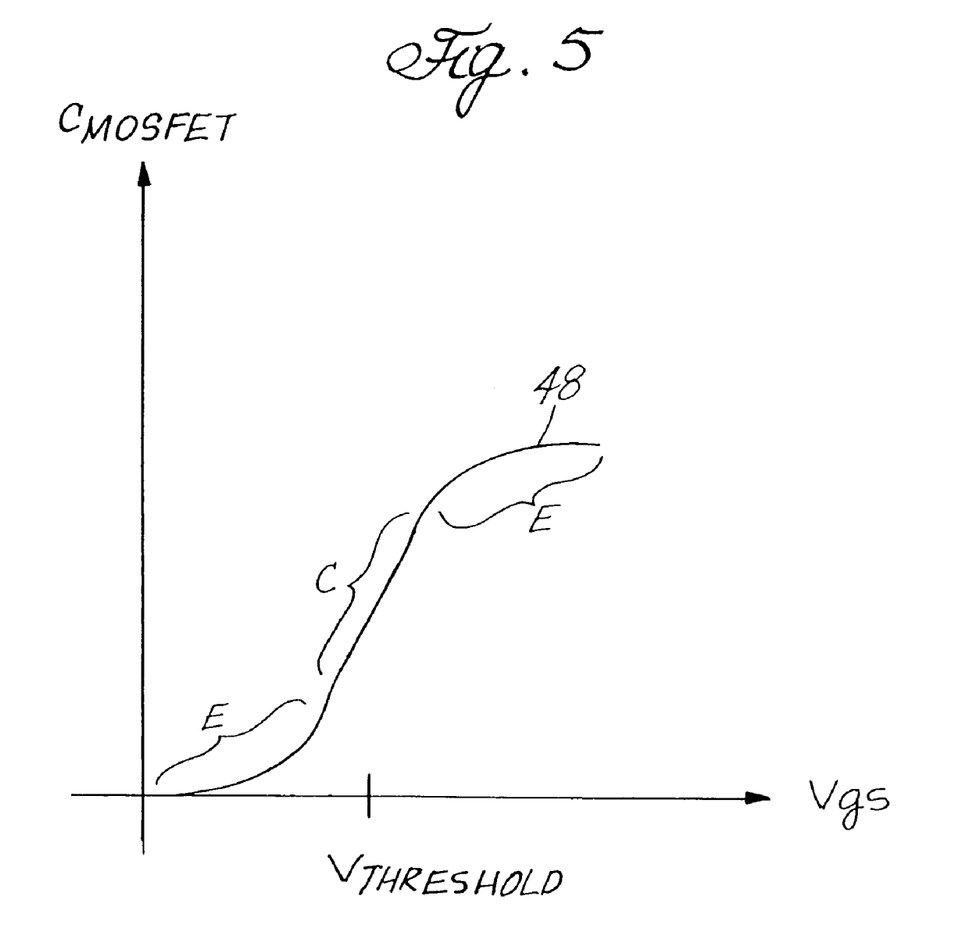
FIG. 5 is a graph of a $C_{gs}$ vs. $V_{gs}$ curve for a CMOS FET varactor that illustrates that the curve defines a sigmoidal function.

The output signals ($V_{control1}$ 34A, $V_{control2}$ 34B and $V_{control3}$ 34C) drive the varactors 26A–B, 28A–B and 30A–B in FIG. 2. Significantly, in some embodiments the Cgs vs. Vgs curve 48 for the varactors 26A–B, 28A–B and 30A–B defines a sigmoidal shape as illustrated, for example, in FIG. 5. As FIG. 5 shows, near the center C of the curve 48 the capacitance of the varactors 26A–B, 28A–B and 30A–B varies in response to a control voltage ($V_{gs}$) in a relatively linear manner. However, the two ends E of the curve are, in effect, clipped. Thus, in the end regions E the capacitance of a varactor does not change appreciably in response to changes in the control voltage ($V_{gs}$).

The sigmoidal characteristic of the varactors 26A–B, 28A–B and 30A–B facilitates use of a circuit whereby all of the varactors 26A–B, 28A–B and 30A–B are electrically coupled to the oscillator tank circuit T at all times. In this case, a control voltage 32 is, in effect, successively applied to the varactors 26A–B, 28A–B and 30A–B such that, for a given range of the control voltage 32 only one of the varactors 26A–B, 28A–B and 30A–B is within its substantially linear range. Given that the varactors 26A–B, 28A–B and 30A–B change capacitance only slightly when operating outside of their substantially linear range (due to the clipping effect described above), the varactors 26A–B, 28A–B and 30A–B do not substantially change the center frequency of the tank circuit T when their control voltage ($V_{gs}$) is outside of the varactor's substantially linear range. Thus, the capacitance of the tank circuit T is, for the most part, altered by controlling one varactor at a time.

Typically, the invention provides smooth transitions when folding from one varactor to the next by incorporating some overlap between the capacitive effect of each varactor on the tank circuit T. For example, the circuit parameters of FIG. 4 (e.g., values of the resistors, magnitude of the current flow from the current sources) may be selected so that $V_{control2}$ 34B starts to change from its steady state (at which time it starts changing the capacitance of varactors 28A and 28B) before $V_{control1}$ 34A goes to its steady state (at which time it stops changing the capacitance of varactors 26A and 26B). Hence, in FIG. 3, when $V_{in}$ 32 is equal to V2, both $V_{control1}$ 34A and $V_{control2}$ 34B correspond to points on the sloped part of their respective curves, rather than the horizontal sections of the curves. By providing sufficient overlap, the folding circuit reduces the likelihood that there will be dead-bands that will adversely affect the operation of the VCO.

To achieve sufficiently smooth transitions, certain constraints should be considered when designing a VCO circuit in accordance with the invention. It is important that variations that may occur in $df_{VCO}/dV_{control}$ as the VCO is tuned are properly considered during the stability and noise analysis stage of the design process for any feedback control loops, i.e., phase-locked loops containing the VCO. The VCO should have sufficient stability margin. And, in some embodiments, it may be preferable to ensure that the slope of the df/dv curve not change excessively.

The invention provides significant advantages over designs that merely switch fixed capacitors in and out of the tank circuit. The invention provides smooth transitions as the circuit folds in each successive varactor/capacitor. Therefore, phase synchronization loops in a receiver utilizing the VCO will not be forced to have to re-lock every time a circuit element is folded into or out of the circuit. This is in marked contrast to a hard switching device where such re-locking could occur every time a capacitor was switched into or out of the circuit.

In sum, the circuit of FIG. 4 will have smooth transitions in the Cgs vs. Vgs and Vout vs. $V_{in}$ curves. Moreover, by allowing some overlap, a smooth $f_{oscillator}$ vs. $V_{in}$ tuning characteristic may be achieved.

Figure 6:
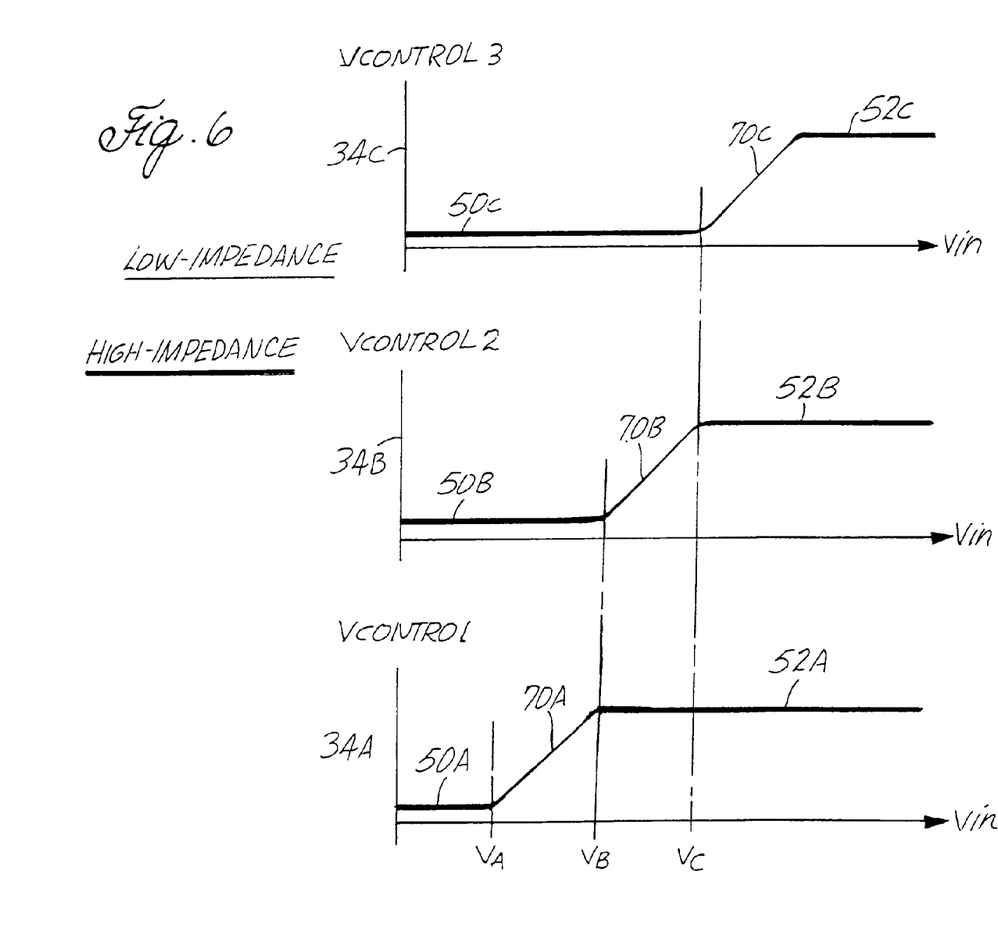
FIG. 6 is a graph illustrating transfer functions for an input control voltage and varactor control voltages according to one embodiment of the invention.

In the case where the varactors 26A–B, 28A–B and 30A–B do not have a sigmoidal C-V (capacitance vs. voltage) characteristic, the invention may utilize a folding circuit designed to have the transfer functions as illustrated in FIG. 6. In the high-impedance regions 50A–C and 52A–C of each transfer function, the corresponding control signal (e.g., $V_{control1}$ 34A) is effectively an open-circuit. As a result, the varactors (e.g., varactors 26A–B) controlled by that control signal are effectively electrically isolated from the tank circuit T. Consequently, a varactor only contributes to a significant degree to oscillator operations such as up-conversion when the varactor's control signal is operating in the low impedance region of the transfer function.

In this embodiment, an additional path is provided which smoothly switches into the tank circuit T a fixed capacitor having a capacitance equal to the maximum varactor capacitance at the upper limit of a corresponding varactor's tuning range. Thus, even though the varactor in this embodiment does not have a clipping capacitance characteristic that naturally takes the varactor out of the circuit, switches in the folding circuit accomplish the same effect, and do so in a relatively smooth manner.

Figure 7:
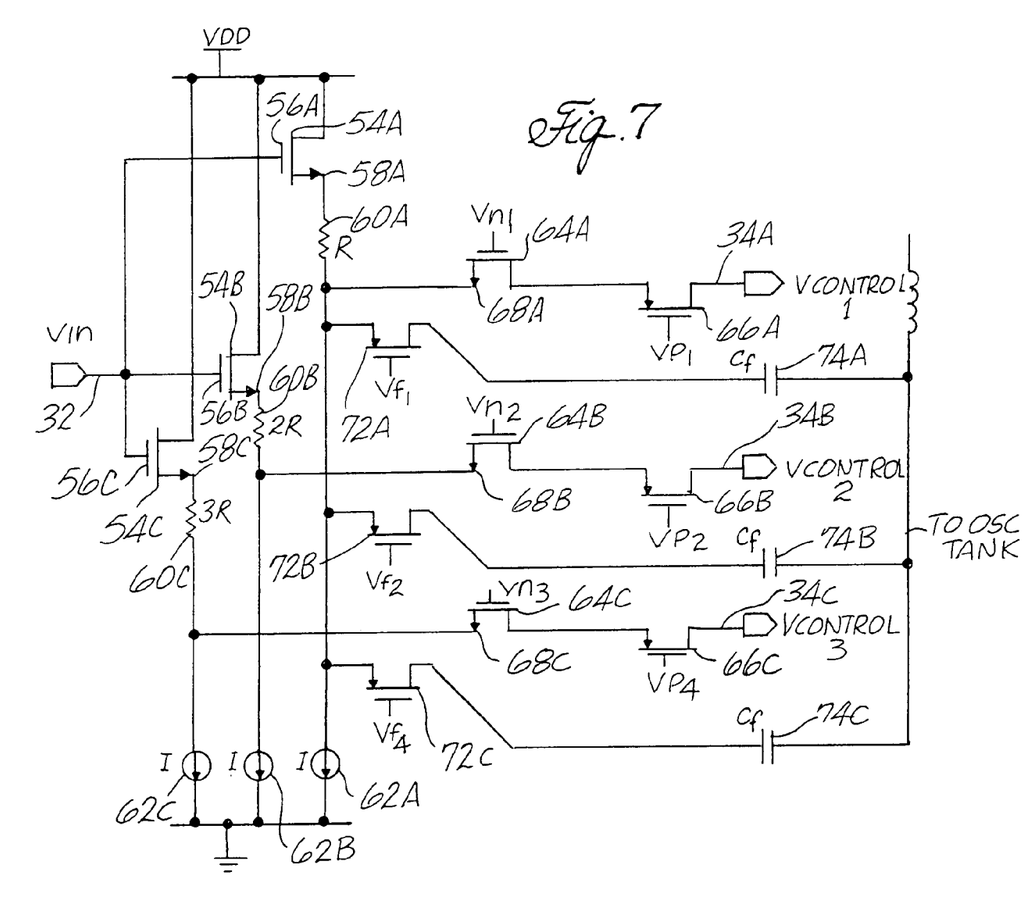
FIG. 7 is a schematic diagram of one embodiment of a folding circuit implementing transfer functions as described by FIG. 6.

FIG. 7 depicts one embodiment of a CMOS folding circuit implementing the transfer functions of FIG. 6. The circuit of FIG. 7 includes three FETs 54A–C connected with their gates 56A–C in parallel and driven by a control signal 32. Connected to the source 58A–C of each FET 54A–C is a resistor 60A–C. In this embodiment, the resistors 60A–C for the three FETs 54A–C have different resistance values. The resistance of the resistors 60A–C is, for the first FET 56A designated as R, for the second FET 54B, 2R (i.e., twice the resistance of the first resistor 60A), and for the third FET 56C, 3R, respectively. The resistors 60A–C, in turn, connect to current sources 62A–C which, in this embodiment, each provide the same amount of drive current, designated I. Current flow through the resistors 60A–C produces different voltage levels at each of the FET sources 58A–C. In a manner similar to that discussed in conjunction with the embodiment of FIG. 4, the values for the current sources 62A–C and the resistors are selected to provide voltage levels that enable the circuit to successively control the varactors 26A–B, 28A–B and 30A–B.

In the embodiment of FIG. 7, each output signal ($V_{control1}$ 34A, $V_{control2}$ 34B and $V_{control3}$ 34C) is supplied via an nFET and pFET pair. $V_n$ and $V_p$ are bias signals that are applied to the gates of the nFETs 64A–C and the pFETs 66A–C. These bias signals are selected, in conjunction with the voltage levels set for the FETs 54A–B and other circuit components, so that the nFET and pFET pair for each output signal 34A–C conduct at the appropriate time to produce the desired transfer functions (i.e., as shown in FIG. 6).

For convenience, both the embodiment of FIG. 4 and the embodiment of FIG. 7 are described as controlling the varactors in FIG. 2. It should be appreciated, however, that typically the two embodiments would be used to control different types of varactors as discussed herein.

Referring to FIGS. 6 and 7, with $V_{in}$ 32 at or near 0 V, none of the FETs 54A–C will be turned on. As a result, the voltage at the sources 68A–C of the nFETs 64A–C will be approximately 0 V. Under these circumstances, the nFETs 64A–C will be on because there will be sufficient bias across their gate to source junction; $V_n$ for each nFET 64A–C being specified as greater than the threshold voltage of a gate to source junction. However, the pFETs 66A–C will not be on because there will not be sufficient bias across their gate to source junction. This is because the voltage at the source of the pFETs 66A–C will not be higher than $V_p$. Thus, each of the output lines 34A–C will present a high impedance to the varactors 26A–B, 28A–B and 30A–B, as represented by the high impedance lines 50A–C in FIG. 6.

As $V_{in}$ 32 increases (traversing left to right on the graph in FIG. 6), the first FET 54A will begin conducting once $V_{in}$ 32 approaches a magnitude (designated $V_A$ in FIG. 6) where it provides a sufficient voltage across the gate to source junction of the FET 54A. Note, however, due to the use of larger resistors 60B–C for the second and third FETs 54B–C that the FETs 54B–C will not be turned on when the first FET 54A is initially turned on. Once the first FET 54A turns on, the voltage at the source 68A will increase. Once this source voltage increases to a level above $V_p$ plus the appropriate junction voltages for pFET 66A and nFET 64A, the pFET 66A will turn on. At that point the $V_{control1}$ 34A signal will become active and will increase in a substantially linear manner as $V_{in}$ increases (see the low impedance section 70A of the transfer function depicted FIG. 6). As $V_{in}$ 32 continues to increase, the voltage at the source 68A of nFET 64A will eventually reach a level where it is higher than $V_n$ minus the threshold voltage for the nFET 64A. At this point, the nFET 64A will turn off and the $V_{control1}$ line 34A will once again present a high impedance 52A as depicted in FIG. 6.

As $V_{in}$ 32 continues to increase, eventually the second FET 54B will turn on and a similar sequence of events as was just described for $V_{control1}$ 34A will transpire to activate $V_{control2}$ 34B. As $V_{in}$ 32 increases further still, the third FET 54C will be turned on and the circuit will generate the $V_{control3}$ signal 34C. Thus, each output control signal 34A–C is sequentially activated over a defined range. When a given control signal 34A–C is not activated it presents a high impedance to its varactor 26A–B, 28A–B and 30A–B.

When a control signal goes to a high impedance state, the associated varactors are effectively isolated from the oscillator tank circuit T. To compensate for the corresponding reduction in the capacitance in the tank circuit T, FETs 72A–C are used to electrically couple (e.g., switch) capacitors 74A–C into the tank circuit T. When a FET 72A–C is turned off (due to too low of a voltage at its gate), the FET 72A–C provides a high impedance that effectively isolates the associated capacitor 74A–C from the tank circuit T.

The bias signals $V_f$ for the FETs 72A–C are set so that when an nFET (e.g., 64A) turns off, the corresponding FET (e.g., 72A) turns on. When the FET 72A turns on it provides a relatively low impedance path to alternating current ground that effectively couples the capacitor 74A to the tank circuit T. The values for the capacitors 74A–C are chosen so that the capacitance coupled into the tank circuit T when a FET 72A–C turns on is the same value of capacitance provided by the varactor 26A–B, 28A–B or 30A–B, just before the control signal 34A–C for the varactor 26A–B, 28A–B or 30A–B went back to the high impedance state 52A–C (FIG. 6). Thus, a circuit constructed according to this embodiment of the invention provides smooth transitions as it sequentially folds each varactor 26A–B, 28A–B or 30A–B into or out of the tank circuit T. Significantly, due to the smoothness of this process, the invention limits the amount of noise that might otherwise be introduced into the system by the addition and or subtraction of circuit elements to the oscillator by hard switching techniques.

From the above it will be appreciated that by proper selection of the bias signals (e.g., $V_p$, $V_n$ and $V_f$) and the DC offsets (e.g., the voltage defined at the source of the FETs to enable the corresponding FET to turn on at a particular level of $V_{in}$) that this embodiment of the invention can achieve staggered sigmoidal characteristics similar to the circuit of FIG. 4. This selection depends, among other factors, on the number of FETs in the circuit. When more FETs are used to provide a larger number of steps, each of the offsets and DC offsets will need to be specified so that the stages are activated in a substantially sequential order.

It should also be appreciated that the folding circuits described herein provide smooth transitions when $V_{in}$ decreases as well. In this case, as $V_{in}$ decreases the stages sequentially fold in and out in an order opposite that described above.

As discussed herein, the invention uses folding techniques, rather than hard switching, to sequentially and smoothly insert multiple small varactors into the frequency-determining circuit of a VCO. Compared to hard switching of fixed capacitors, the techniques described herein allow the VCO to maintain a desired frequency in the face of temperature and other environmental and electrical fluctuations without undesired phase and amplitude transients.

This folding technique applied to varactor control is capable of significantly reducing phase noise in VCO's in which flicker noise up-converted by the nonlinear varactor capacitance is the dominant noise mechanism. Because the frequency sensitivity of each varactor control line is reduced by approximately N over the single-varactor circuit, the noise requirements placed on the folding circuit are modest, and large power dissipation and area is not required. Thus, in general, it is desirable to use very small (i.e., low capacitance) varactors to reduce the signal noise as much as possible. This design choice must, of course, be made taking into consideration other constraints on the circuit design.

In a preferred embodiment of the circuit of FIG. 7, the small varactors are successively replaced by fixed capacitors. By using fixed capacitors, the effective Q of the oscillator's tank circuit may be improved. This is because fixed capacitors, generally realized with metal electrodes and a low-loss dielectric such as silicon dioxide on an integrated circuit, will have less series resistance than a varactor realized with a semiconductor structure. The lower series resistance leads to lower losses and higher Q. This, in turn, reduces phase noise as is well-known in the art.

The improved performance of the VCO may be exploited for improved system performance, or alternatively, the VCO power may be scaled down to reduce system power dissipation at the same current.

From the above it may be seen that the invention provides effective techniques for reducing flicker noise up-conversion in oscillators in which the center frequency is tuned using variable-capacitance elements (varactors). In particular, the invention provides a technique for reducing flicker noise generated by internal components of the oscillator. While certain exemplary structures and operations have been described, the invention is not so limited. For example a variety of switching circuits may be employed to provide the functions of the FETs described herein. An oscillator may be designed with one or more folding circuits or it may incorporate one or more VCO control signals. Thus the scope of the invention is to be determined according to the claims set forth below.

What is claimed is:

1. An electronic oscillator, comprising:
   a first varactor having a first capacitance based on a first control signal;
   a second varactor having a second capacitance based on a second control signal; and
   a folding circuit to independently control the first and second control signals.

2. The electronic oscillator of claim 1, wherein an output frequency of the electronic oscillator is based on the first and second capacitances.

3. The electronic oscillator of claim 2, wherein the output frequency changes substantially linearly in response to the folding circuit sequentially manipulating the first control signal and the second control signal.

4. The electronic oscillator of claim 1, wherein the folding circuit sequentially manipulates the first capacitance and the second capacitance, and wherein the folding circuit begins manipulating one of the first and second capacitances before the folding circuit finishes manipulating the other of the first and second capacitances.

5. The electronic oscillator of claim 1, wherein the first varactor has a first sigmoidal response characteristic and the second varactor has a second sigmoidal response characteristic, and wherein the folding circuit sequentially manipulates the first sigmoidal response characteristic and the second sigmoidal response characteristic to provide a smooth transition of an output frequency of the electronic oscillator.

6. The electronic oscillator of claim 1, wherein the folding circuit manipulates the second control signal in response to the folding circuit decoupling the first varactor and replacing the first capacitance with a fixed capacitance.

7. The electronic oscillator of claim 1, wherein the folding circuit successively replaces the first varactor and the second varactor with a first fixed capacitor and a second fixed capacitor, respectively.

8. The electronic oscillator of claim 1, further comprising an oscillator control circuit to provide an oscillator control signal, wherein the folding circuit generates the first and second control signals based on the oscillator control signal.

9. The electronic oscillator of claim 8, wherein the folding circuit manipulates the first capacitance in response to the oscillator control signal exceeding a threshold.

10. The electronic oscillator of claim 8, wherein the folding circuit includes:
    a first current source coupled to a source of a first transistor that is associated with the first control signal;
    a second current source coupled to a source of a second transistor that is associated with the second control signal;
    wherein a gate of the first transistor and a gate of the second transistor receive the oscillator control signal.

11. The electronic oscillator of claim 10, wherein the first transistor and the second transistor have different gate-to-source threshold voltages.

12. The electronic oscillator of claim 1, wherein one of the first capacitance and the second capacitance is susceptible to modulation by a flicker noise fluctuation.

13. The electronic oscillator of claim 1, further comprising a third varactor having a third capacitance based on the first control signal, wherein the first varactor and the third varactor are electrically isolated from each other.

14. The electronic oscillator of claim 1, wherein the first varactor includes a first pair of varactors and the second varactor includes a second pair of varactors.

15. The electronic oscillator of claim 1, wherein the first and second varactors are included in a tank circuit, and wherein the electronic oscillator further comprises a switch to switchably decouple the first varactor from the tank circuit and to switchably couple to the tank circuit a capacitor having a fixed capacitance equal to a corresponding capacitance of the first varactor.

16. The electronic oscillator of claim 1, wherein the first and second varactors are coupled together in parallel.

17. The electronic oscillator of claim 1, wherein the first and second varactors are coupled together in parallel across an active portion of the electronic oscillator.

18. A method of controlling an output frequency of an electronic oscillator that includes a first varactor and a second varactor, the method comprising:
    varying a first capacitance of the first varactor based on a first control signal;
    varying a second capacitance of the second varactor based on a second control signal; and
    independently controlling the first and second control signals based on an oscillator control signal of the electronic oscillator.

19. The method of claim 18, further comprising changing the output frequency substantially linearly in response to sequentially manipulating the first control signal and the second control signal.

20. The method of claim 18, further comprising sequentially manipulating a first sigmoidal response characteristic of the first varactor and a second sigmoidal response characteristic of the second varactor to provide a smooth transition of the output frequency.

21. The method of claim 18, wherein varying the second control signal is performed in response to decoupling the first varactor and replacing the first capacitance with a fixed capacitance.

22. The method of claim 18, further comprising sequentially manipulating the first capacitance and the second capacitance, and beginning to manipulate one of the first and second capacitances before finishing manipulation of the other of the first and second capacitances.

* * * * *